US008160274B2

(12) United States Patent
Bongiovi

(10) Patent No.: US 8,160,274 B2
(45) Date of Patent: Apr. 17, 2012

(54) SYSTEM AND METHOD FOR DIGITAL SIGNAL PROCESSING

(75) Inventor: Anthony Bongiovi, Port St. Lucie, FL (US)

(73) Assignee: Bongiovi Acoustics LLC., Port St. Lucie, FL (US)

( * ) Notice: Subject to any disclaimer, the term of this patent is extended or adjusted under 35 U.S.C. 154(b) by 1143 days.

(21) Appl. No.: 11/947,301

(22) Filed: Nov. 29, 2007

(65) Prior Publication Data

US 2008/0137881 A1 Jun. 12, 2008

Related U.S. Application Data

(63) Continuation-in-part of application No. 11/703,216, filed on Feb. 7, 2007.

(60) Provisional application No. 60/861,711, filed on Nov. 30, 2006, provisional application No. 60/765,722, filed on Feb. 7, 2006.

(51) Int. Cl.
*H03G 5/00* (2006.01)

(52) U.S. Cl. .......... 381/98; 381/312; 381/320; 381/321; 381/57; 381/99; 381/100; 381/101; 381/102; 381/103; 381/104; 381/105; 381/106; 381/107; 381/108; 381/109; 704/225

(58) Field of Classification Search .................... 381/98, 381/86, 312, 320, 321, 57, 99, 100, 101, 381/102, 103, 104, 105, 106, 107, 108, 109; 704/225
See application file for complete search history.

(56) References Cited

U.S. PATENT DOCUMENTS

| | | | | |
|---|---|---|---|---|
| 4,184,047 | A | 1/1980 | Langford | |
| 4,356,558 | A | 10/1982 | Owen et al. | |
| 4,612,665 | A | 9/1986 | Inami et al. | |
| 4,696,044 | A * | 9/1987 | Waller, Jr. | 381/106 |
| 5,210,806 | A | 5/1993 | Kihara et al. | |
| 5,465,421 | A | 11/1995 | McCormick et al. | |
| 5,699,438 | A | 12/1997 | Smith et al. | |
| 5,990,955 | A | 11/1999 | Koz | |
| 6,263,354 | B1 | 7/2001 | Gandhi | |
| 6,292,511 | B1 | 9/2001 | Goldston et al. | |
| 6,317,117 | B1 * | 11/2001 | Goff | 345/156 |
| 6,871,525 | B2 | 3/2005 | Withnall et al. | |
| 6,907,391 | B2 | 6/2005 | Bellora et al. | |
| 2003/0035555 | A1 | 2/2003 | King et al. | |
| 2003/0216907 | A1 | 11/2003 | Thomas | |
| 2004/0146170 | A1 | 7/2004 | Zint | |
| 2005/0201572 | A1 | 9/2005 | Lindahl et al. | |
| 2005/0254564 | A1 | 11/2005 | Tsutsui | |
| 2006/0098827 | A1 | 5/2006 | Paddock et al. | |
| 2007/0253577 | A1 * | 11/2007 | Yen et al. | 381/103 |
| 2008/0137881 | A1 | 6/2008 | Bongiovi | |
| 2009/0062946 | A1 | 3/2009 | Bongiovi et al. | |
| 2009/0296959 | A1 | 12/2009 | Bongiovi | |

FOREIGN PATENT DOCUMENTS

| | | |
|---|---|---|
| JP | 07-106876 | 4/1995 |

* cited by examiner

*Primary Examiner* — Kimberly Nguyen
*Assistant Examiner* — Mohammad T Karimy
(74) *Attorney, Agent, or Firm* — Malloy & Malloy, P.L.

(57) ABSTRACT

The present invention provides for methods and systems for digitally processing an audio signal. Specifically, the present invention provides for a headliner speaker system that is configured to digitally process an audio signal in a manner such that studio-quality sound that can be reproduced.

19 Claims, 12 Drawing Sheets

Figure 2: Low shelving filters with cutoff frequency at 1000 Hz and gains $\pm G dB$ Figure 3: Making a Low Shelving Filter by Summing High-Pass and Low-Pass Filters Figure 4: High shelving filters with cutoff frequency at 1000 Hz and gains ± GdB Figure 5: Frequency Response of a Bell Filter Figure 6: Expanded View of Graphic Equalizer Block $GEQ(z)$ From Figure 1

Figure 7: Making a Filter Via the Mitra-Regalia Realization

Figure 8: Magnitude-Complementary Low-Shelving Filters

Figure 9: Implementation of Magnitude-Complementary Low-Shelving Filter

Figure 10: Compressor Static Transfer Characteristic

Figure 11: Direct Form Type 1 Implementation of 2nd-Order Transfer Function

Figure 12: Direct Form Type 1 Implementation of 2nd-Order Transfer Function

SYSTEM AND METHOD FOR DIGITAL SIGNAL PROCESSING

CROSS-REFERENCE TO RELATED APPLICATIONS

This application claims priority to U.S. Provisional Application No. 60/861,711 filed Nov. 30, 2006, and is a continuation-in-part of U.S. application Ser. No. 11/703,216, filed Feb. 7, 2007, which claims priority to U.S. Provisional Application No. 60/765,722, filed Feb. 7, 2006. Each of the above applications is incorporated by reference herein in its entirety.

FIELD OF THE INVENTION

The present invention provides for methods and systems for digitally processing an audio signal. Specifically, some embodiments relate to digitally processing an audio signal in a manner such that studio-quality sound that can be reproduced across the entire spectrum of audio devices.

BACKGROUND OF THE INVENTION

Historically, studio-quality sound, which can best be described as the full reproduction of the complete range of audio frequencies that are utilized during the studio recording process, has only been able to be achieved, appropriately, in audio recording studios. Studio-quality sound is characterized by the level of clarity and brightness which is attained only when the upper-mid frequency ranges are effectively manipulated and reproduced. While the technical underpinnings of studio-quality sound can be fully appreciated only by experienced record producers, the average listener can easily hear the difference that studio-quality sound makes.

While various attempts have been made to reproduce studio-quality sound outside of the recording studio, those attempts have come at tremendous expense (usually resulting from advanced speaker design, costly hardware, and increased power amplification) and have achieved only mixed results. Thus, there exists a need for a process whereby studio-quality sound can be reproduced outside of the studio with consistent, high quality, results at a low cost. There exists a further need for audio devices embodying such a process, as well as computer chips embodying such a process that may be embedded within audio devices. There also exists a need for the ability to produce studio-quality sound through inexpensive speakers.

Further, the design of audio systems for vehicles involves the consideration of many different factors. The audio system designer selects the position and number of speakers in the vehicle. The desired frequency response of each speaker must also be determined. For example, the desired frequency response of a speaker that is located on the instrument panel may be different than the desired frequency response of a speaker that is located on the lower portion of the rear door panel.

The audio system designer must also consider how equipment variations impact the audio system. For example, an audio system in a convertible may not sound as good as the same audio system in the same model vehicle that is a hard top. The audio system options for the vehicle may also vary significantly. One audio option for the vehicle may include a basic 4-speaker system with 40 watts amplification per channel while another audio option may include a 12-speaker system with 200 watts amplification per channel. The audio system designer must consider all of these configurations when designing the audio system for the vehicle. For these reasons, the design of audio systems is time consuming and costly. The audio system designers must also have a relatively extensive background in signal processing and equalization.

Given those considerations, in order to achieve something approaching studio-quality sound in a vehicle historically one would have required a considerable outlay of money, including expensive upgrades of the factory-installed speakers. As such, there is a need for a system that can reproduce studio-quality sound in a vehicle without having to make such expensive outlays.

SUMMARY OF THE INVENTION

The present invention meets the existing needs described above by providing for a method of digitally processing an audio signal in a manner such that studio-quality sound that can be reproduced across the entire spectrum of audio devices. The present invention also provides for a computer chip that can digitally processing an audio signal is such a manner, and provides for audio devices that comprise such a chip.

The present invention further meets the above stated needs by allowing inexpensive speakers to be used in the reproduction of studio-quality sound. Furthermore, the present invention meets the existing needs described above by providing for a mobile audio device that can be used in a vehicle to reproduce studio-quality sound using the vehicle's existing speaker system by digitally manipulating audio signals. Indeed, even the vehicle's factory-installed speakers can be used to achieve studio-quality sound using the present invention.

In one embodiment, the present invention provides for a method comprising the steps of inputting an audio signal, adjusting the gain of that audio signal a first time, processing that signal with a first low shelf filter, processing that signal with a first high shelf filter, processing that signal with a first compressor, processing that signal with a second low shelf filter, processing that signal with a second high shelf filter, processing that signal with a graphic equalizer, processing that signal with a second compressor, and adjusting the gain of that audio signal a second time. In this embodiment, the audio signal is manipulated such that studio-quality sound is produced. Further, this embodiment compensates for any inherent volume differences that may exist between audio sources or program material, and produces a constant output level of rich, full sound.

This embodiment also allows the studio-quality sound to be reproduced in high-noise environments, such as moving automobiles. Some embodiments of the present invention allow studio-quality sound to be reproduced in any environment. This includes environments that are well designed with respect to acoustics, such as, without limitation, a concert hall. This also includes environments that are poorly designed with respect to acoustics, such as, without limitation, a traditional living room, the interior of vehicles and the like. Further, some embodiments of the present invention allow the reproduction of studio-quality sound irrespective of the quality of the electronic components and speakers used in association with the present invention. Thus, the present invention can be used to reproduce studio-quality sound with both top-of-the-line and bottom-of-the-line electronics and speakers, and with everything in between.

In some embodiments, this embodiment may be used for playing music, movies, or video games in high-noise environments such as, without limitation, an automobile, airplane, boat, club, theatre, amusement park, or shopping center. Furthermore, in some embodiments, the present invention seeks to improve sound presentation by processing an audio signal outside the efficiency range of both the human ear and audio transducers which is between approximately 600 Hz and approximately 1,000 Hz. By processing audio outside this range, a fuller and broader presentation may be obtained.

In some embodiments, the bass portion of the audio signal may be reduced before compression and enhanced after compression, thus ensuring that the sound presented to the speakers has a spectrum rich in bass tones and free of the muffling effects encountered with conventional compression. Furthermore, in some embodiments, as the dynamic range of the audio signal has been reduced by compression, the resulting output may be presented within a limited volume range. For example, the present invention may comfortably present studio-quality sound in a high-noise environment with an 80 dB noise floor and a 110 dB sound threshold.

In some embodiments, the method specified above may be combined with over digital signal processing methods that are perform before the above-recited method, after the above-recited method, or intermittently with the above-recited method.

In another specific embodiment, the present invention provides for a computer chip that may perform the method specified above. In one embodiment, the computer chip may be a digital signal processor, or DSP. In other embodiments, the computer chip may be any processor capable of performing the above-stated method, such as, without limitation, a computer, computer software, an electrical circuit, an electrical chip programmed to perform these steps, or any other means to perform the method described.

In another embodiment, the present invention provides for an audio device that comprises such a computer chip. The audio device may comprise, for example and without limitation: a radio: a CD player; a tape player; an MP3 player; a cell phone; a television; a computer; a public address system: a game station such as a Playstation 3 (Sony Corporation—Tokyo, Japan), an X-Box 360 (Microsoft Corporation—Redmond, Wash.), or a Nintendo Wii (Nintendo Co., Ltd.—Kyoto, Japan); a home theater system; a DVD player; a video cassette player; or a Blu-Ray player.

In such an embodiment, the chip of the present invention may be delivered the audio signal after it passes through the source selector and before it reaches the volume control. Specifically, in some embodiments the chip of the present invention, located in the audio device, processes audio signals from one or more sources including, without limitation, radios, CD players, tape players, DVD players, and the like. The output of the chip of the present invention may drive other signal processing modules or speakers, in which case signal amplification is often employed.

Specifically, in one embodiment, the present invention provides for a mobile audio device that comprises such a computer chip. Such a mobile audio device may be placed in an automobile, and may comprise, for example and without limitation, a radio, a CD player, a tape player, an MP3 player, a DVD player, or a video cassette player.

In this embodiment, the mobile audio device of the present invention may be specifically tuned to each vehicle it may be used in to obtain optimum performance and to account for unique acoustic properties in each vehicle such as speaker placement, passenger compartment design, and background noise. Also in this embodiment, the mobile audio device of the present invention may provide precision tuning for all 4 independently controlled channels. Also in this embodiment, the mobile audio device of the present invention may deliver about 200 watts of power. Also in this embodiment, the mobile audio device of the present invention may use the vehicle's existing (sometimes factory-installed) speaker system to produce studio-quality sound. Also in this embodiment, the mobile audio device of the present invention may comprise a USB port to allow songs in standard digital formats to be played. Also in this embodiment, the mobile audio device of the present invention may comprise an adapter for use with satellite radio. Also in this embodiment, the mobile audio device of the present invention may comprise an adaptor for use with existing digital audio playback devices such as, without limitation, MP3 players. Also in this embodiment, the mobile audio device of the present invention may comprise a remote control. Also in this embodiment, the mobile audio device of the present invention may comprise a detachable faceplate.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Figure 1:
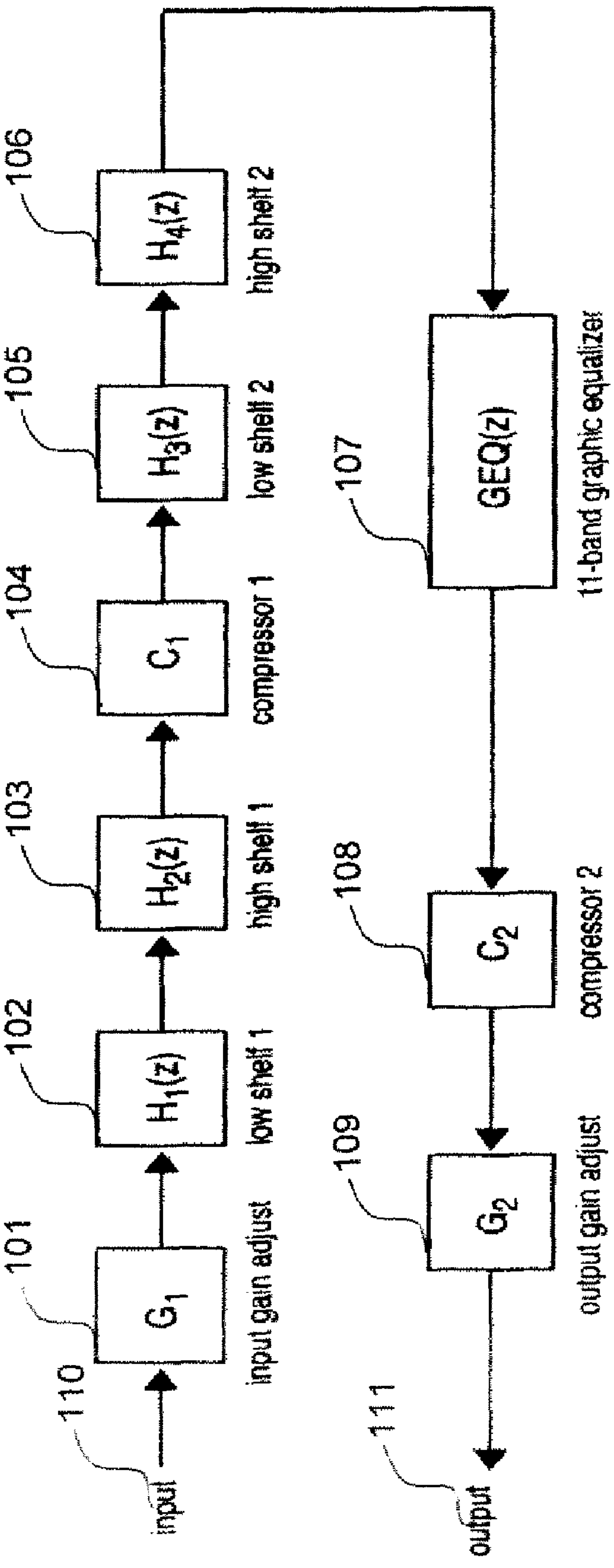
FIG. 1 shows a block diagram of one embodiment of the digital signal processing method of the present invention.

The Figures are not intended to be exhaustive or to limit the invention to the precise form disclosed. It should be understood that the invention can be practiced with modification and alteration, and that the invention be limited only by the claims and the equivalents thereof.

DETAILED DESCRIPTION

It is to be understood that the present invention is not limited to the particular methodology, compounds, materials, manufacturing techniques, uses, and applications described herein, as these may vary. It is also to be understood that the terminology used herein is used for the purpose of describing particular embodiments only, and is not intended to limit the scope of the present invention. It must be noted that as used herein and in the appended embodiments, the singular forms "a," "an," and "the" include the plural reference unless the context clearly dictates otherwise. Thus, for example, a reference to "an audio device" is a reference to one or more audio devices and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures.

1.0 Overview

First, some background on linear time-invariant systems is helpful. A linear, time-invariant (LTI) discrete-time filter of order N with input x[k] and output y[k] is described by the following difference equation:

$$y[k]=b_0x[k]+b_1x[k-1]+\ldots+b_Nx[k-N]+\alpha_1y[k-1]+_2y[k-2]+\ldots+\alpha_Ny[k-N]$$

where the coefficients {b0, b1, . . . , bN, a1, a2, . . . , aN} are chosen so that the filter has the desired characteristics (where the term desired can refer to time-domain behavior or frequency domain behavior).

The difference equation above can be excited by an impulse function, δ[k], whose value is given by $$\delta[k]=\begin{cases}1, & k=0\\ 0, & k\neq 0\end{cases}$$

When the signal δ[k] is applied to the system described by the above difference equation, the result is known as the impulse response, h[k]. It is a well-known result from system theory that the impulse response h[k] alone completely characterizes the behavior of a LTI discrete-time system for any input signal. That is, if h[k] is known, the output y[k] for an input signal x[k] can be obtained by an operation known as convolution. Formally, given h[k] and x[k], the response y[k] can be computed as $$y[k]=\sum_{n=0}^{\infty}h[n]x[k-n]$$

Some background on the z-transform is also helpful. The relationship between the time-domain and the frequency-domain is given by a formula known as the z-transform. The z-transform of a system described by the impulse response h[k] can be defined as the function H(z) where $$H(z)=\sum_{k=0}^{\infty}h[k]z^{-k}$$

and z is a complex variable with both real and imaginary parts. If the complex variable is restricted to the unit circle in the complex plane (i.e., the region described by the relationship [z]=1), what results is a complex variable that can be described in radial form as $$z=e^{j\theta},\text{ where } 0\leqq\theta\leqq 2\pi \text{ and } j=\sqrt{-1}$$

Some background on the discrete-time fourier transform is also instructive. With z described in radial form, the restriction of the z-transform to the unit circle is known as the discrete-time Fourier transform (DTFT) and is given by $$H(e^{j\theta})=\sum_{k=0}^{\infty}h[k]e^{-jk\theta}$$

Of particular interest is how the system behaves when it is excited by a sinusoid of a given frequency. One of the most significant results from the theory of LTI systems is that sinusoids are eigenfunctions of such systems. This means that the steady-state response of an LTI system to a sinusoid sin(θ0k) is also a sinusoid of the same frequency θ 0, differing from the input only in amplitude and phase. In fact, the steady-state output, yss[k] of the LTI system when driven by and input x[k]=sin (θ 0k) is given by $$y_{zy}[k]=A\sin(\theta_0k+\Phi_0)$$

where $$A=|H(e^{j\theta_0})$$

and $$\Phi_0=\arg(H(e^{j\theta}{}_0))$$

Finally, some background on frequency response is needed. The equations above are significant because indicate that the steady-state response of an LTI system when driven by a sinusoid is a sinusoid of the same frequency, scaled by the magnitude of the DTFT at that frequency and offset in time by the phase of the DTFT at that frequency. For the purposes of the present invention, what is of concern is the amplitude of the steady state response, and that the DTFT provides us with the relative magnitude of output-to-input when the LTI system is driven by a sinusoid. Because it is well-known that any input signal may be expressed as a linear combination of sinusoids (the Fourier decomposition theorem), the DTFT can give the response for arbitrary input signals. Qualitatively, the DTFT shows how the system responds to a range of input frequencies, with the plot of the magnitude of the DTFT giving a meaningful measure of how much signal of a given frequency will appear at the system's output. For this reason, the DTFT is commonly known as the system's frequency response.

2.0 Digital Signal Processing

FIG. 1 illustrates an example digital signal process flow of a method 100 according to one embodiment of the present invention. Referring now to FIG. 1, method 100 includes the following steps: input gain adjustment 101, first low shelf filter 102, first high shelf filter 103, first compressor 104, second low shelf filter 105, second high shelf filter 106, graphic equalizer 107, second compressor 108, and output gain adjustment 109.

In one embodiment, digital signal processing method 100 may take as input audio signal 110, perform steps 101-109, and provide output audio signal 111 as output. In one embodiment, digital signal processing method 100 is executable on a computer chip, such as, without limitation, a digital signal processor, or DSP. In one embodiment, such a chip may be one part of a larger audio device, such as, without limitation, a radio, MP3 player, game station, cell phone, television, computer, or public address system. In one such embodiment, digital signal processing method 100 may be performed on the audio signal before it is outputted from the audio device. In one such embodiment, digital signal processing method 100 may be performed on the audio signal after it has passed through the source selector, but before it passes through the volume control.

In one embodiment, steps 101-109 may be completed in numerical order, though they may be completed in any other order. In one embodiment, steps 101-109 may exclusively be performed, though in other embodiments, other steps may be performed as well. In one embodiment, each of steps 101-109 may be performed, though in other embodiments, one or more of the steps may be skipped.

In one embodiment, input gain adjustment 101 provides a desired amount of gain in order to bring input audio signal 110 to a level that will prevent digital overflow at subsequent internal points in digital signal processing method 100.

In one embodiment, each of the low-shelf filters 102, 105 is a filter that has a nominal gain of 0 dB for all frequencies above a certain frequency termed the corner frequency. For frequencies below the corner frequency, the low-shelving filter has a gain of ±G dB, depending on whether the low-shelving filter is in boost or cut mode, respectively. This is shown in FIG. 2.

Figure 2:
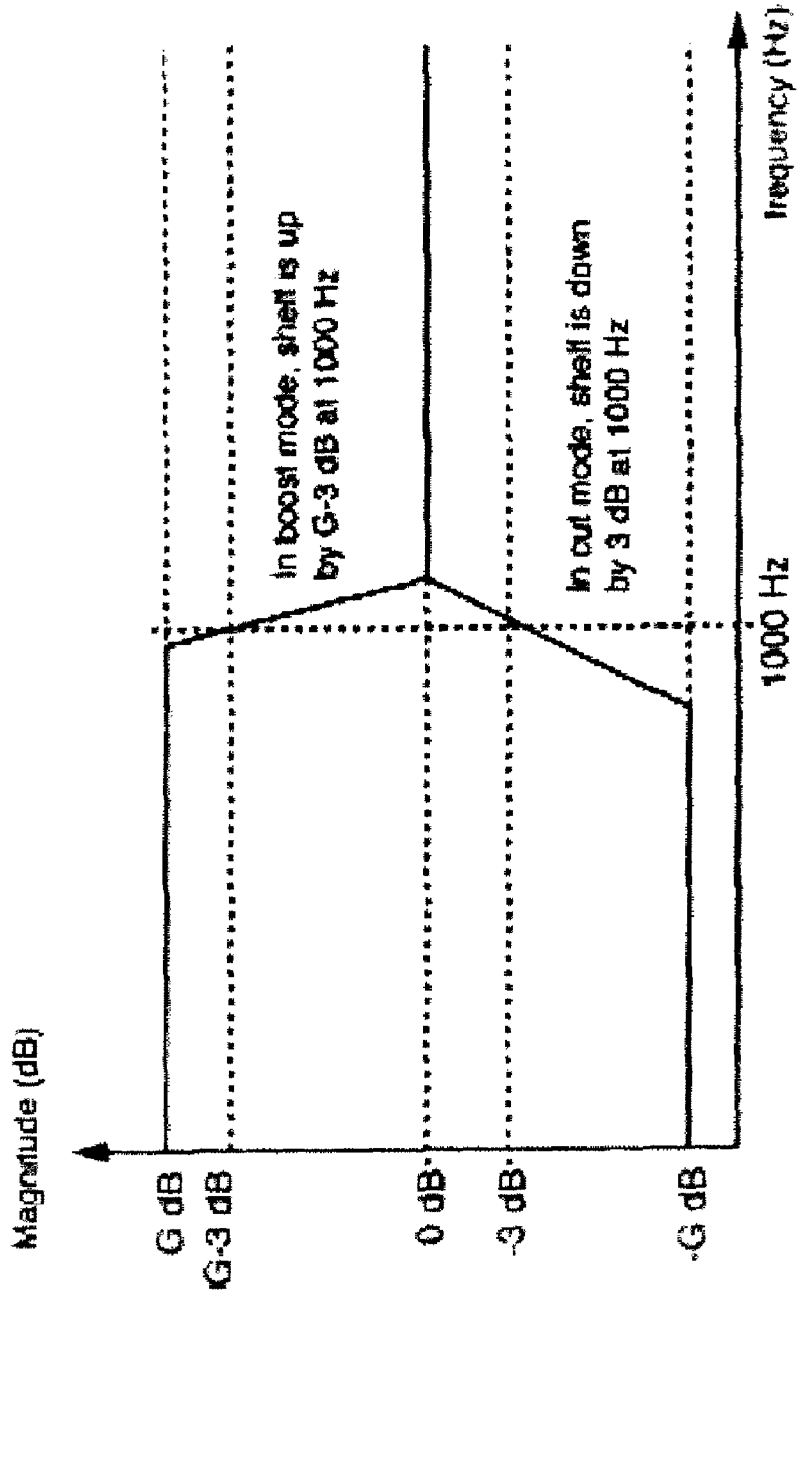
FIG. 2 shows the effect of a low-shelf filter used in one embodiment of the digital signal processing method of the present invention.

FIG. 2 illustrates the effect of a low-shelf filter being implemented by one embodiment of the present invention. Referring now to FIG. 2, the purpose of a low-shelving filter is to leave all of the frequencies above the corner frequency unaltered, while boosting or cutting all frequencies below the corner frequency by a fixed amount, G dB. Also note that the 0 dB point is slightly higher than the desired 1000 Hz. It is standard to specify a low-shelving filter in cut mode to have a response that is at −3 dB at the corner frequency, whereas a low-shelving filter in boost mode is specified such that the response at the corner frequency is at G−3 dB—namely, 3 dB down from maximum boost. Indeed, all of the textbook formulae for creating shelving filters lead to such responses. This leads to a certain amount of asymmetry, where for almost all values of boost or cut G, the cut and boost low-shelving filters are not the mirror images of one another. This is something that needed to be address by the present invention, and required an innovative approach to the filters' implementations.

Figure 3:
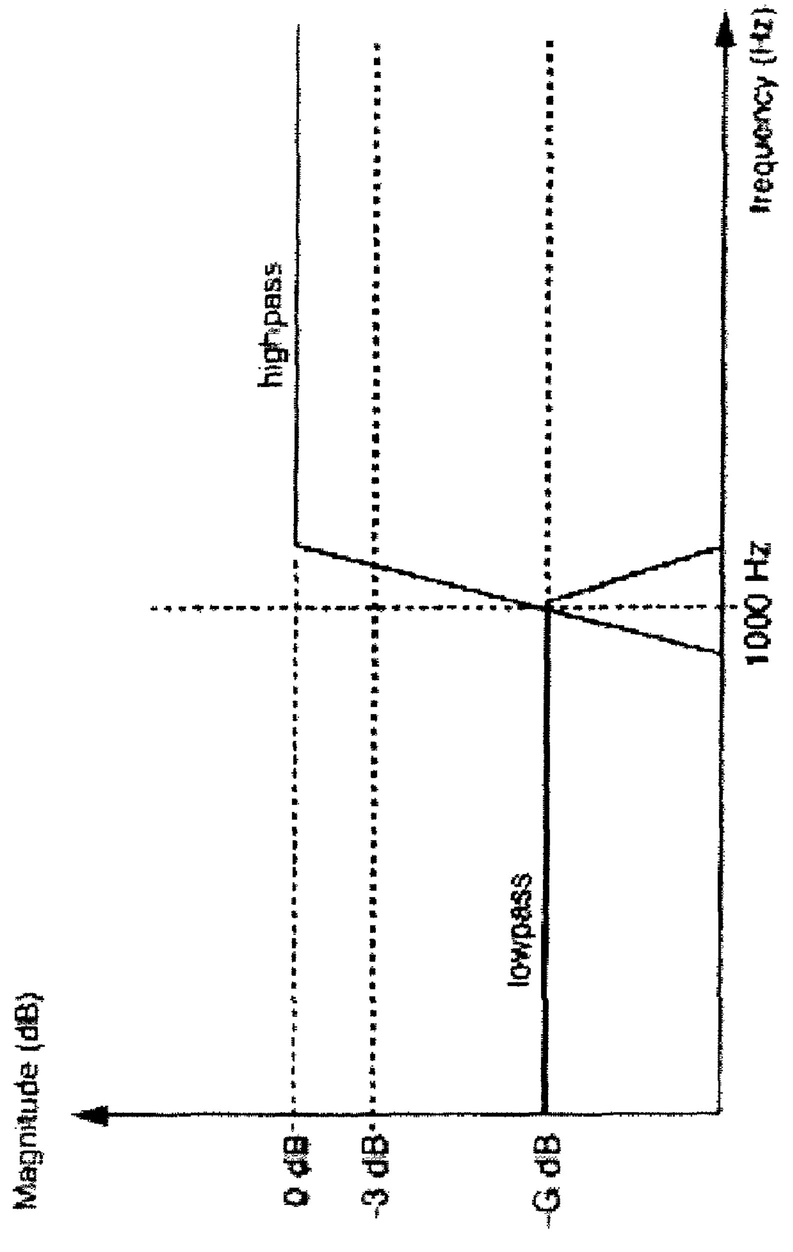
FIG. 3 shows how a low-shelf filter can be created using high-pass and low-pass filters.

Ignoring for now the asymmetry, the standard method for creating a low-shelving filter is as the weighted sum of high-pass and lowpass filters. For example, let's consider the case of a low-shelving filter in cut mode with a gam of −G dB and a corner frequency of 1000 Hz. FIG. 3 shows a highpass filter with a 1000 cutoff frequency and a lowpass filter with a cutoff frequency of 1000 Hz, scaled by −G dB. The aggregate effect of these two filters applied in series looks like the low-shelving filter in FIG. 2. In practice, there are some limitations on the steepness of the transition from no boost or cut to G dB of boost or cut. FIG. 3 illustrates this limitation, with the corner frequency shown at 1000 Hz and the desired G dB of boost or cut not being achieved until a particular frequency below 1000 Hz. It should be noted that all of the shelving filters in the present invention are first-order shelving filters, which means they can usually be represented by a first-order rational transfer function:

$$H(z) = \frac{b_0 + b_1 z^{-1}}{1 + a_1 z^{-1}}.$$

Figure 4:
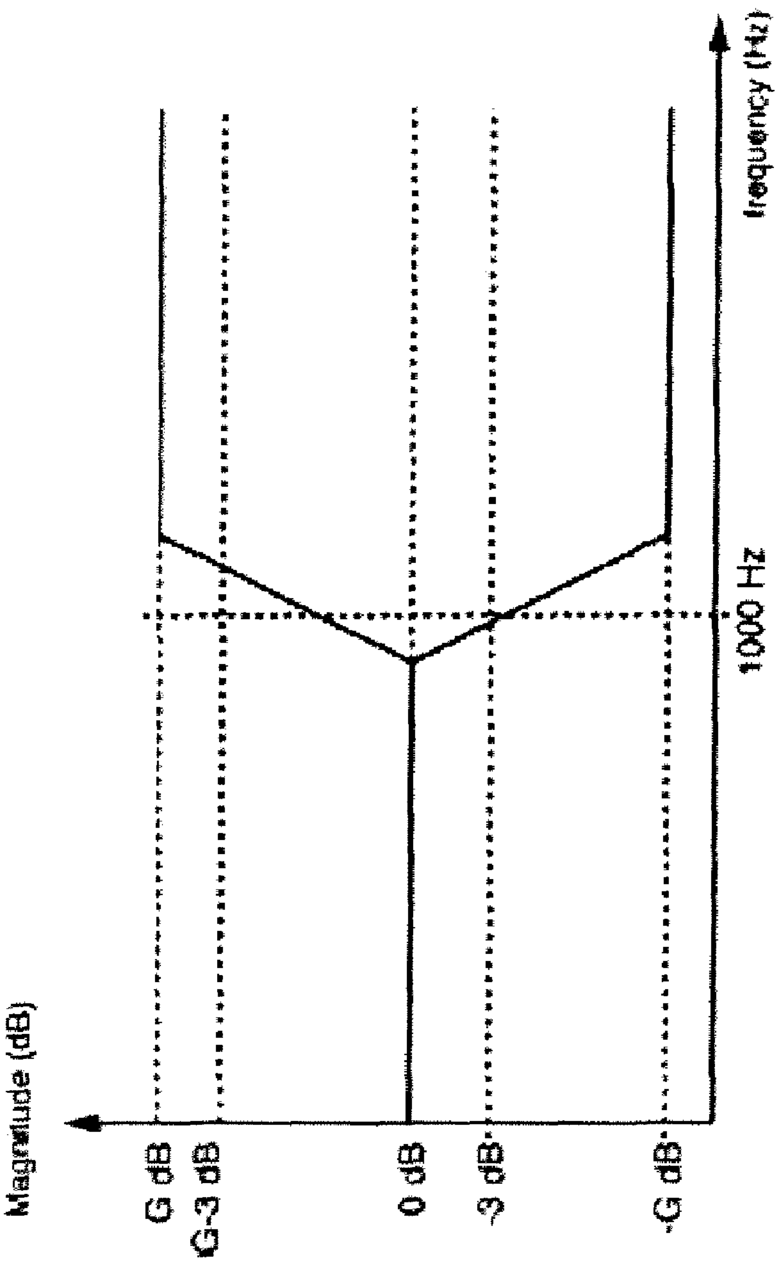
FIG. 4 shows the effect of a high-shelf filter used in one embodiment of the digital signal processing method of the present invention.

In some embodiments, each of the high-shelf filters 103, 106 is nothing more than the mirror image of a low-shelving filter. That is, all frequencies below the corner frequency are left unmodified, whereas the frequencies above the corner frequency are boosted or cut by G dB. The same caveats regarding steepness and asymmetry apply to the high-shelving filter. FIG. 4 illustrates the effect of a high-shelf filter implemented by an embodiment of the present invention. Referring now to FIG. 4, a 1000 Hz high-shelving filter is shown.

Figure 5:
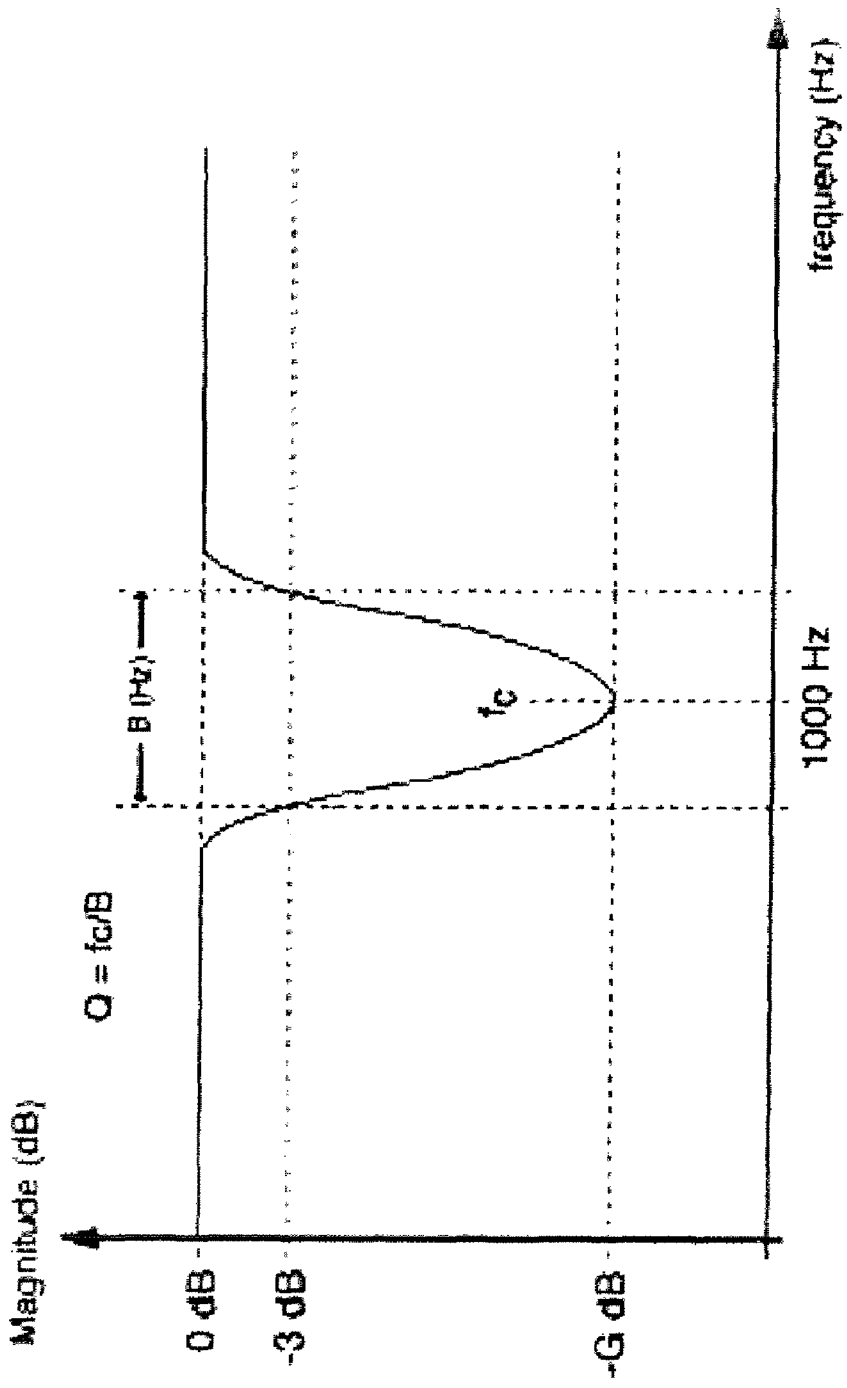
FIG. 5 shows the frequency response of a bell filter used in one embodiment of the digital signal processing method of the present invention.

FIG. 5 illustrates an example frequency response of a bell filter implemented by method 100 according to one embodiment of the present invention. As shown in FIG. 5, each of the second order filters achieves a bell-shaped boost or cut at a fixed centerfrequency, with F1(z) centered at 30 Hz, F11(z) centered at 16000 Hz, and the other filters in between centered at roughly one-octave intervals. Referring to FIG. 5, a bell-shaped filter is shown centered at 1000 Hz. The filter has a nominal gain of 0 dB for frequencies above and below the center frequency, 1000 Hz, a gain of −G dB at 1000 Hz, and a bell-shaped response in the region around 1000 Hz.

The shape of the filter is characterized by a single parameter: the quality factor, Q. The quality factor is defined as the ratio of the filter's center frequency to its 3-dB bandwidth, B, where the 3-dB bandwidth is illustrated as in the figure: the difference in Hz between the two frequencies at which, the filter's response crosses the −3 dB point.

Figure 6:
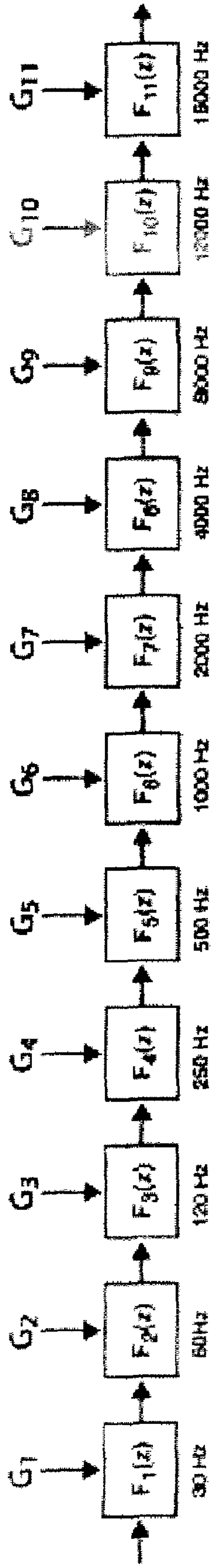
FIG. 6 shows a block diagram of one embodiment of a graphic equalizer used in one embodiment of the digital signal processing method of the present invention.

FIG. 6 illustrates an example graphic equalizer block 600 according to one embodiment of the present invention. Referring now to FIG. 6, graphic equalizer 600 consists of a cascaded bank of eleven second-order filters, $F_1(z)$, $F_2(z)$, . . . , $F_{11}(z)$. In one embodiment, graphic equalizer 107 (as shown in FIG. 1) is implemented as graphic equalizer 600.

Each of the eleven second-order filters in the present invention can be computed from formulas that resemble this one:

$$F(z) = \frac{b_0 + b_1 z^{-1} + b_2 z^{-2}}{1 + a_1 z^{-1} + a_2 z^{-2}}.$$

Using such an equation results in one problem: each of the five coefficients above, $\{b_0, b_1, b_2, a_1, a_2\}$ depends directly on the quality factor, Q, and the gain, G. This means that for the filter to be tunable, that is, to have variable Q and G, all five coefficients must be recomputed in real-time. This can be problematic, as such calculations could easily consume the memory available to perform graphic equalizer 107 and create problems of excessive delay or fault, which is unacceptable. This problem can be avoided by utilizing the Mitra-Regalia Realization.

A very important result from the theory of digital signal processing (DSP) is used to implement the filters used in digital signal processing method 100. This result states that a wide variety of filters (particularly the ones used in digital signal processing method 100) can be decomposed as the weighted sum of an allpass filter and a feedforward branch from the input. The importance of this result will become clear. For the time being, suppose that a second-order transfer function, H(z), is being implements to describes a bell filter centered at fc with quality factor Q and sampling frequency Fs by $$H(z) = \frac{b_0 + b_1 z^{-1} + b_2 z^{-2}}{1 + a_1 z^{-1} + a_2 z^{-2}}$$

Ancillary quantities k1, k2 can be defined by $$k_1 = \frac{1 - \tan\left(\frac{\pi f_s}{QF_s}\right)}{1 + \tan\left(\frac{\pi f_s}{QF_s}\right)}$$

$$k_2 = -\cos(2\pi f_s / F_s)$$

and transfer function, A(z) can be defined by $$A(z) = \frac{k_2 + k_1(1 + k_2)z^{-1} + z^{-2}}{1 + k_1(1 + k_2)z^{-1} + k_2 z^{-2}}$$

A(z) can be verified to be an allpass filter. This means that the amplitude of A(z) is constant for all frequencies, with only the phase changing as a function of frequency. A(z) can be used as a building block for each bell-shaped filter. The following very important result can be shown:

$$H(z) = \frac{1}{2}(1 + G)A(z) + \frac{1}{2}(1 - G)$$

Figure 7:
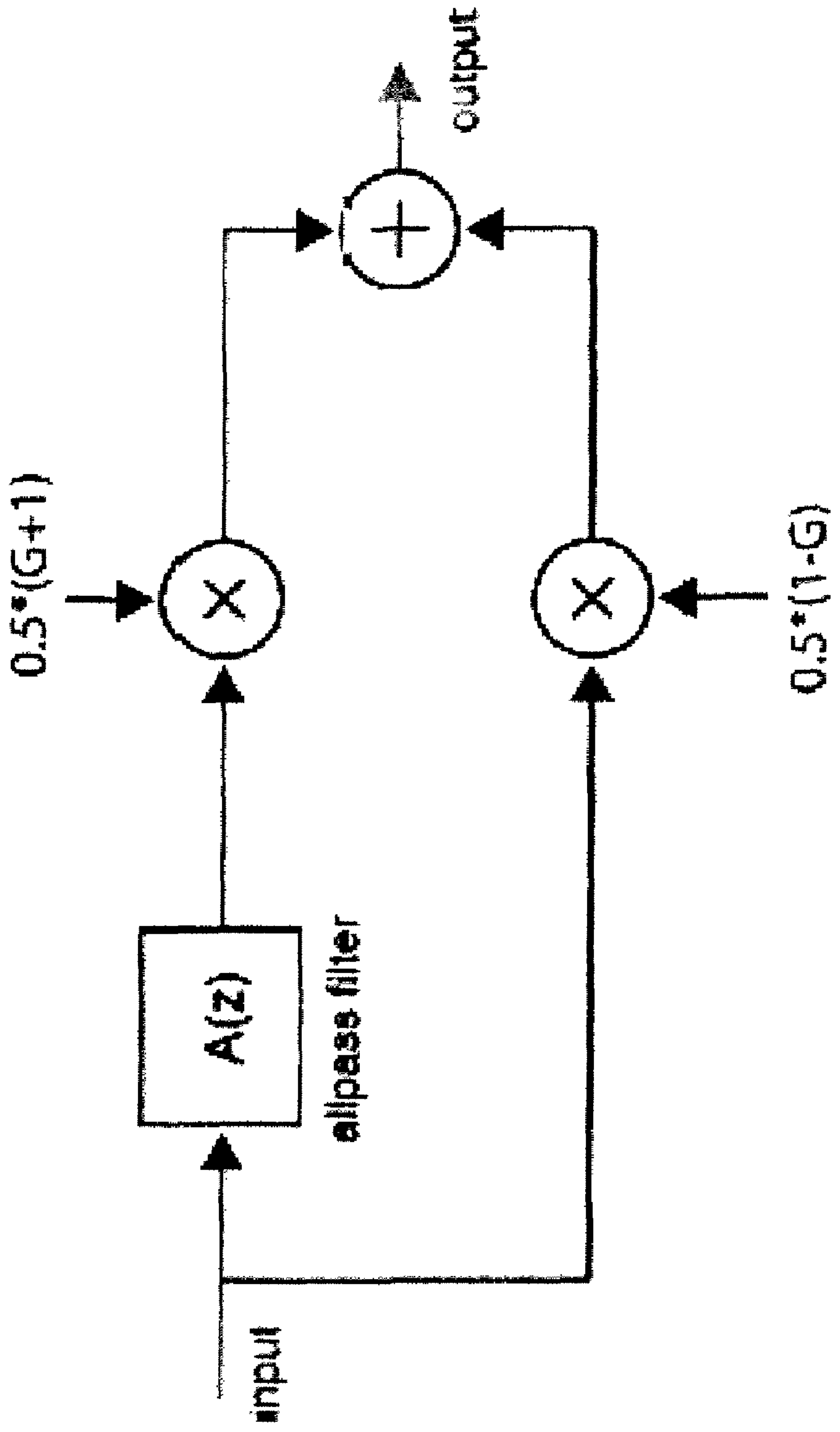
FIG. 7 shows a block diagram showing how a filter can be constructed using the Mitra-Regalia realization.

This is the crux of the Mitra-Regalia realization. A bell filter with tunable gain can be implemented to show the inclusion of the gain G in a very explicit way. This is illustrated in FIG. 7, which illustrates an example filter constructed using the Mitra-Regalia realization according to one embodiment of the present invention.

There's a very good reason for decomposing the filter in such a non-intuitive manner. Referring to the above equation, remember that every one of the a and b coefficients needs to be re-computed whenever G gets changed (i.e., whenever one of the graphic EQ "slider" is moved). Although the calculations that need to be performed for the a and b coefficients have not been shown, they are very complex and time-consuming and it simply isn't practical to recompute them in real time. However, in a typical graphic EQ, the gain G and quality factor Q remain constant and only G is allowed to vary. This is what makes the equation immediately above so appealing. Notice from the above equations that A(z) does not depend in any way on the gain, G and that if Q and the center-frequency fc remain fixed (as they do in a graphic EQ filter), then k1 and k2 remain fixed regardless of G. Thus, these variables only need to be computed once! Computing the gain variable is accomplished by varying a couple of simple quantities in real time:

$$\frac{1}{2}(1 + G)$$

and $$\frac{1}{2}(1 - G).$$

These are very simple computations and only require a couple of CPU cycles. This leaves only the question of how to implement the allpass transfer function, A(z), which is a somewhat trivial exercise. The entire graphic equalizer bank thus consists of 11 cascaded bell filters, each of which is implemented via its own Mitra-Regalia realization:

| | | |
|---|---|---|
| $F_1(z)$ | → | fixed $k_1^1$, $k_2^1$, variable $G_1$ |
| $F_1(z)$ | → | fixed $k_1^2$, $k_2^2$, variable $G_2$ |
| . | | . |
| . | | . |
| . | | . |
| $F_{11}(z)$ | → | fixed $k_1^{11}$, $k_2^{11}$, variable $G_{11}$ |

It can be seen from that equation that the entire graphic equalizer bank depends on a total of 22 fixed coefficients that need to be calculated only once and stored in memory. The "tuning" of the graphic equalizer is accomplished by adjusting the parameters G1, G2, . . . , G11. Refer back to FIG. 6 to see this in schematic form. The Mitra-Regalia realization will be used over and over in the implementation of the various filters used digital signal processing method 100. Mitra-Regalia is also useful in implementing the shelving filters, where it is even simpler because the shelving filters use first-order filter. The net result is that a shelving filter is characterized by a single allpass parameter, k, and a gain, G. As with the bell filters, the shelving filters are at fixed corner frequencies (in fact, all of them have 1 kHz as their corner frequency) and the bandwidth is also fixed. All told, four shelving filters are completely described simply by

| | | |
|---|---|---|
| $H_1(z)$ | → | fixed $k^1$, variable $G_1$ |
| $H_2(z)$ | → | fixed $k^2$, variable $G_2$ |
| $H_3(z)$ | → | fixed $k^3$, variable $G_3$ |
| $H_4(z)$ | → | fixed $k^4$, variable $G_4$ |

Figure 8:
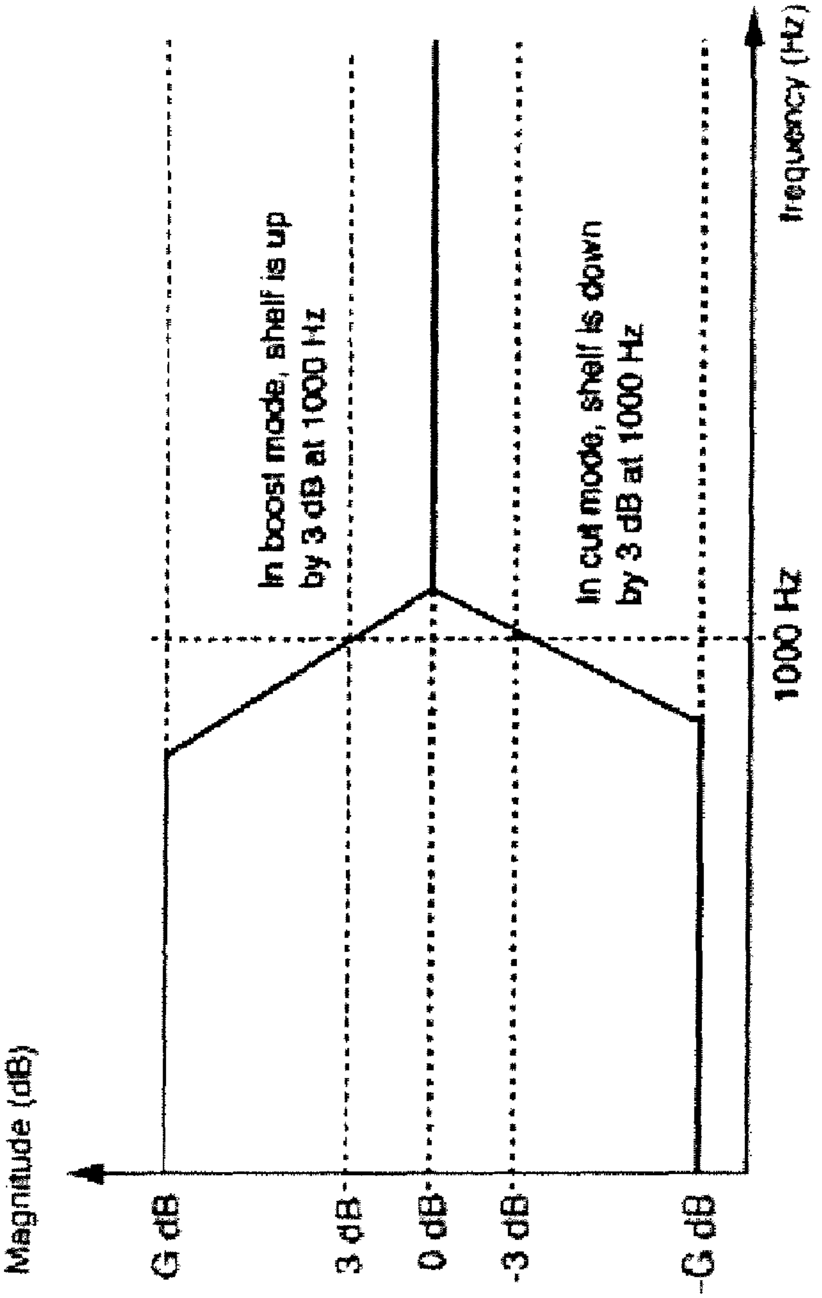
FIG. 8 shows the effect of magnitude-complementary low-shelf filters that may be used in one embodiment of the digital signal processing method of the present invention.

As discussed above, there is an asymmetry in the response of a conventional shelving filter when the filter is boosting versus when it is cutting. This is due, as discussed, to the design technique having different definitions for the 3-dB point when boosting than when cutting. Digital signal processing method 100 relies on the filters H1(z) and H3(z) being the mirror images of one another and the same holds for H2(z) and H4(z). This led to the use of a special filter structure for the boosting shelving filters, one that leads to perfect magnitude cancellation for H1,H3 and H2,H4, as shown in FIG. 8. This type of frequency response is known as magnitude complementary. This structure is unique to the present invention. In general, it is a simple mathematical exercise to derive for any filter H(z) a filter with complementary magnitude response. The filter H−1(z) certainly fits the bill, but may not be stable or implementable function of z, in which case the solution is merely a mathematical curiosity and is useless in practice. This is the case with a conventional shelving filter. The equations above show how to make a bell filter from an allpass filter. These equation applies equally well to constructing a shelving filter beginning with a first-order allpass filter, A(z), where $$A(z) = \frac{\alpha - z^{-1}}{1 - \alpha z^{-1}}$$

and α is chosen such that $$\alpha = \frac{\left(1 - \sin\left(\frac{2\pi f_s}{F_s}\right)\right)}{\cos\left(\frac{2\pi f_s}{F_s}\right)}$$

where fc is the desired corner frequency and Fs is the sampling frequency. Applying the above equations and re-arranging terms, this can be expressed as $$H(z) = \frac{1+G}{2}\left\{1 + \frac{1-G}{1+G}A(z)\right\}.$$

This is the equation for a low-shelving filter. (A high-shelving filter can be obtained by changing the term (1−G) to (G−1)). Taking the inverse of H(z) results in the following:

$$\frac{1}{H(z)} = \frac{2}{(1+G)\left(1 + \frac{1-G}{1+G}A(z)\right)}$$

This equation is problematic because it contains a delay-free loop, which means that it can not be implemented via conventional state-variable methods. Fortunately, there are some recent results from system theory that show how to implement rational functions with delay-free loops. Fontana and Karjalainen show that each step can be “split” in time into two “sub-steps.”

Figure 9:
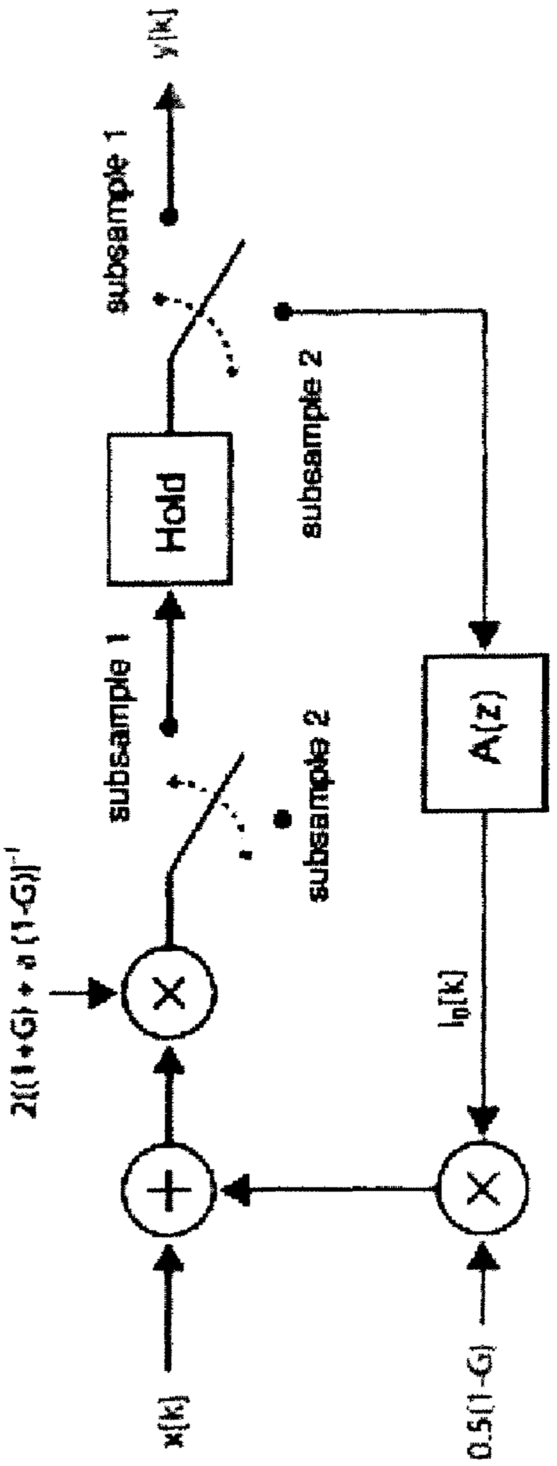
FIG. 9 shows a block diagram of an implementation of a magnitude-complementary low-shelf filter that may be used in one embodiment of the digital signal processing method of the present invention.

FIG. 9 illustrates an example magnitude-complementary low-shelf filter according to one embodiment of the present invention. Refer to FIG. 9, during the first sub-step (labeled “subsample 1”), feed filter A(z) with zero input and compute its output, 10[k]. During this same subsample, calculate the output y[k] using the value of 10[k], which from the equation immediately above can be performed as follows:

$$y[k] = \frac{1}{1 + a\frac{1-G}{1+G}}\left\{\frac{2}{1+G}x[k] + \frac{1-G}{1+G}l_0[k]\right\}$$

-continued $$= \frac{2}{(1+G) + a(1-G)}\left\{x[k] + \frac{1-G}{2}l_0[k]\right\}$$

It can be seen from FIG. 9 that these two calculations correspond to the case where the switches are in the “subsample 1” position. Next, the switches are thrown to the “subsample 2” position and the only thing left to do is update the internal state of the filter A(z). This unconventional filter structure results in perfect magnitude complementarity, 11. This can be exploited for the present invention in the following manner: when the shelving filters of digital signal processing method 100 are in “cut” mode, the following equation can be used:

$$H(z) = \frac{1+G}{2}\left\{1 + \frac{1-G}{1+G}A(z)\right\}.$$

However, when the shelving filters of digital signal processing method 100 are in “boost” mode, the following equation can be used with the same value of G as used in “cut” mode:

$$y[k] = \frac{1}{1 + a\frac{1-G}{1+G}}\left\{\frac{2}{1+G}x[k] + \frac{1-G}{1+G}l_0[k]\right\}$$

$$= \frac{2}{(1+G) + a(1-G)}\left\{x[k] + \frac{1-G}{2}l_0[k]\right\}$$

This results in shelving filters that are perfect mirror images of on another, as per FIG. 8, which is what is needed for digital signal processing method 100, (Note: Equation 16 can be changed to make a high-shelving filter by changing the sign on the (1-G)/2 term). FIG. 8 illustrates the effect of a magnitude-complementary low-shelf filter implemented by an embodiment of the present invention.

Figure 10:
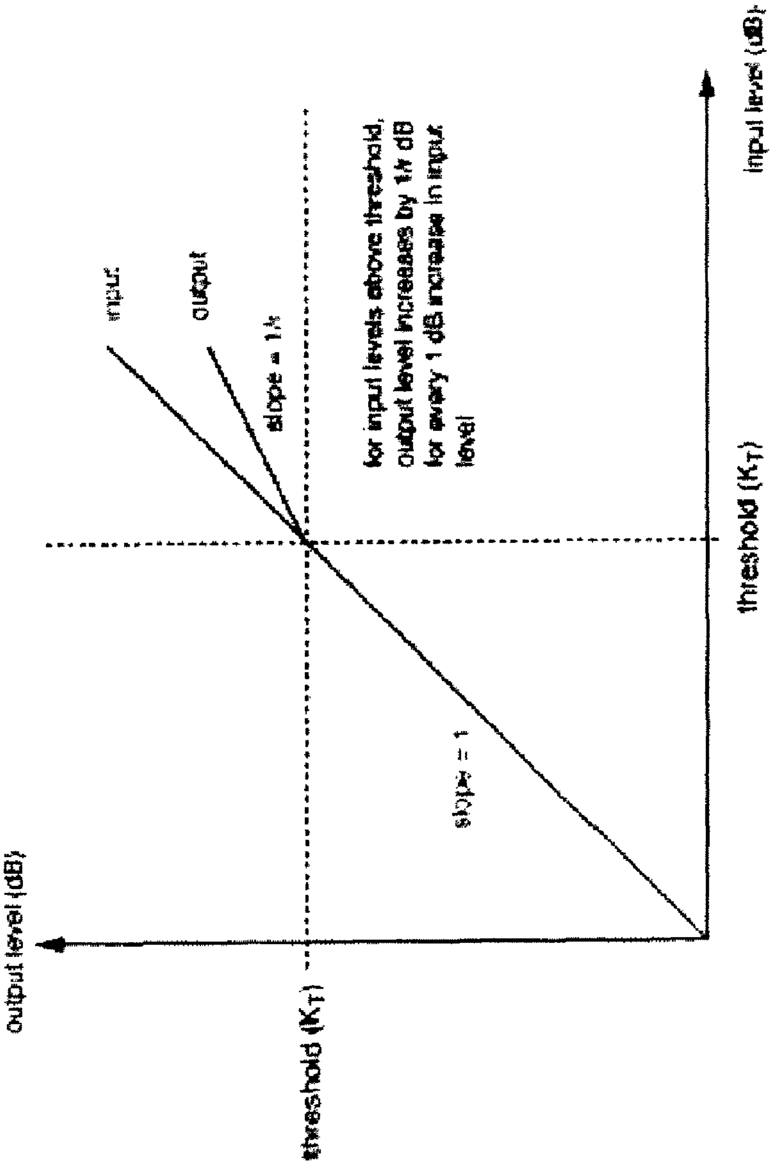
FIG. 10 shows the static transfer characteristic (the relationship between output and input levels) of a compressor used in one embodiment of the digital signal processing method of the present invention.

Each of the compressors 104, 108 is a dynamic range compressor designed to alter the dynamic range of a signal by reducing the ratio between the signal’s peak level and its average level. A compressor is characterized by four quantities: the attack time, Tatt, the release time, Trel, the threshold, KT, and the ratio, r. In brief, the envelope of the signal is tracked by an algorithm that gives a rough “outline” of the signal’s level. Once that level surpasses the threshold, KT, for a period of time equal to Tatt, the compressor decreases the level of the signal by the ratio r dB for every dB above KT. Once the envelope of the signal falls below KT for a period equal to the release time, Trel, the compressor stops decreasing the level. FIG. 10 illustrates a static transfer characteristic (relationship between output and input levels) of a compressor implemented in accordance to one embodiment of the present invention.

It is instructive to examine closely the static transfer characteristic. Assume that the signal’s level, L[k] at instant k has been somehow computed. For instructive purposes, a one single static level, L, will be considered. If L is below the compressor’s trigger threshold, KT, the compressor does nothing and allows the signal through unchanged. If, however, L is greater than KT, the compressor attenuates the input signal by r dB for every dB by which the level L exceeds KT.

It is instructive to consider an instance where L is greater than KT, which means that $20\log_{10}(L)>20\log_{10}(KT)$. In such an instance, the excess gain, i.e., the amount in dB by which the level exceeds the threshold, is: $g_{excess}$=20 $\log_{10}$(L)−20 $\log_{10}$ (KT). As the compressor attenuates the input by r dB for every dB of excess gain, the gain reduction, gR, can be expressed as $$g_R = \frac{g_{excess}}{R} = \frac{1}{R}\cdot(20\log_{10}(L) - 20\log_{10}(K_T))$$

From that, it follows that that with the output of the compressor, y given by 20 $\log_{10}$(y)=gR*20 $\log_{10}$(x), that the desired output-to-input relationship is satisfied.

Conversion of this equation to the linear, as opposed to the logarithmic, domain yields the following:

$$y = (10^{\log_{10}(x)})^{\frac{1}{K}\cdot(\log_{10}(L)-\log_{10}(K_T))}$$

Which is equivalent to:

$$y = x^{\frac{1}{K}\cdot(\log_{10}(L)-\log_{10}(K_T))} = x^{\frac{1}{K}\cdot(\log_{10}(L/K_T))}$$

The most important part of the compressor algorithm is determining a meaningful estimate of the signal's level. This is accomplished in a fairly straightforward way: a running "integration" of the signal's absolute value is kept, where the rate at which the level is integrated is determined by the desired attack time. When the instantaneous level of the signal drops below the present integrated level, the integrated level is allowed to drop at a rate determined by the release time. Given attack and release times Tatt and Trel, the equation used to keep track of the level, L[k] is given by $$L[k] = \begin{cases} (1-\alpha_{att})|x[k]| + \alpha_{att}L[k-1] & \text{for } |x[k]| \geq L[k-1] \\ (1-\alpha_{rel})|x[k]| + \alpha_{rel}L[k-1] & \text{for } |x[k]| < L[k-1] \end{cases}$$

where $$\alpha_{att} = \exp\left(\frac{1}{F_sT_{att}}\right)$$

and $$\alpha_{rel} = \exp\left(\frac{1}{5F_sT_{rel}}\right)$$

At every point of the level calculation as described above, L[k] as computed is compared to the threshold KT, and if L[k] is greater than KT, the input signal, x[k], is scaled by an amount that is proportional to the amount by which the level exceeds the threshold. The constant of proportionality is equal to the compressor ratio, r. After a great deal of mathematical manipulation, the following relationship between the input and the output of the compressor is established:

With the level I[k] as computed in Equation 18, the quantity Gexcess by is computed as $$G_{excess}=L[k]K_T^{-1},$$

which represents the amount of excess gain. If the excess gain is less than one, the input signal is not changed and passed through to the output, hi the event that the excess gain exceeds one, the gain reduction, GR is computed by:

$$G_R = (G_{excess})^{\frac{1-r}{r}} = (L[k]K_T^{-1})^{\frac{1-r}{r}}$$

and then the input signal is scaled by GR and sent to the output:

$$\text{output}[k]=G_Rx[k].$$

Through this procedure, an output signal whose level increases by 1/r dB for every 1 dB increase in the input signal's level is created.

In practice, computing the inverse $K_T^{-1}$ for the above equations can be time consuming, as certain computer chips are very bad at division in real-time. As KT is known in advance and it only changes when the user changes it, a pre-computed table of $K_T^{-1}$ values can be stored in memory and used as needed. Similarly, the exponentiation operation in the above equation calculating GR is extremely difficult to perform in real time, so pre-computed values can be used as an approximation. Since quantity GR is only of concern when Gexcess is greater than unity, a list of, say, 100 values of GR, pre-computed at integer values of GR from GR=11 to GR=100 can be created for every possible value of ratio r. For non-integer values of GR (almost all of them), the quantity in the above equation calculating GR can be approximated in the following way. Let interp be the amount by which Gexcess exceeds the nearest integral value of Gexcess. In other words, $$\text{interp}=G_{excess}-\lfloor(G_{excess})\rfloor$$

and let GR,0 and GR,1 refer to the pre-computed values $$G_{R,0} = \lfloor(G_{excess})\rfloor^{\frac{1-r}{r}}$$

and $$G_{R,1} = \lfloor 1+(G_{excess})\rfloor^{\frac{1-r}{r}}.$$

Linear interpolation may then be used to compute an approximation of GR as follows:

$$G_R \approx G_{R,0}+\text{interp}\neq(G_{R,1}-G_{R,0})$$

The error between the true value of GR and the approximation in the above equation can be shown to be insignificant for the purposes of the present invention. Furthermore, the computation of the approximate value of GR requires only a few arithmetic cycles and several reads from pre-computed tables. In one embodiment, tables for six different values of ratio, r, and for 100 integral points of Gexcess may be stored in memory. In such an embodiment, the entire memory usage is only 600 words of memory, which can be much more palatable than the many hundred cycles of computation that would be necessary to calculate the true value of GR directly. This is a major advantage of the present invention.

Each of the digital filters in digital signal processing method 100 may be implemented using any one a variety of potential architectures or realizations, each of which has its trade-offs in terms of complexity, speed of throughput, coefficient sensitivity, stability, fixedpoint behavior, and other numerical considerations. In a specific embodiment, a simple architecture known as a direct-form architecture of type 1 (DF1) may be used. The DF1 architecture has a number of desirable properties, not the least of which is its clear correspondence to the difference equation and the transfer function of the filter in question. All of the digital filters in digital signal processing method 100 are of either first or second order.

The second-order filter will be examined in detail first. As discussed above, the transfer function implemented in the second-order filter is given by $$H(z)=\frac{b_0+b_1z^{-1}+b_2z^{-2}}{1+a_1z^{-1}+a_2z^{-2}},$$

which corresponds to the difference equation $$y[k]=b_0x[k]+b_1x[k-1]b_2x[k-2]-\alpha_1y[k-1]-\alpha_2y[k-2].$$

Figure 11:
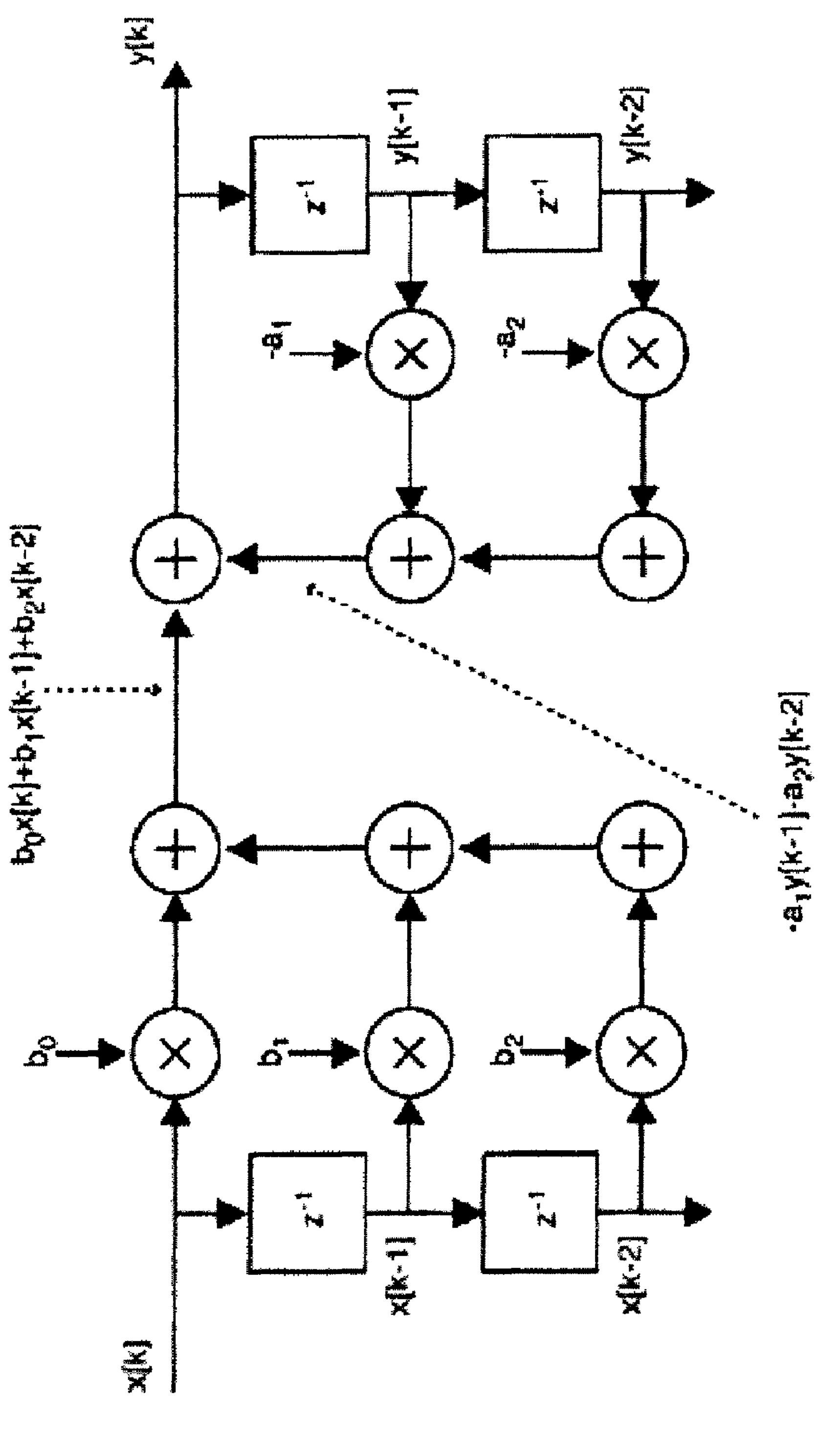
FIG. 11 shows a block diagram of a direct form type 1 implementation of second order transfer function used in one embodiment of the digital signal processing method of the present invention.

FIG. 11 illustrates the DF1 architecture for a second-order filter according to one embodiment of the present invention. As shown in FIG. 11, the multiplier coefficients in this filter structure correspond to the coefficients in the transfer function and in the difference equation above. The blocks marked with the symbol z-1 are delay registers, the outputs of which are required at every step of the computation. The outputs of these registers are termed state variables and memory is allocated for them in some embodiments of digital signal processing method 100. The output of the digital filter is computed as follows:

Initially, every one of the state variables is set to zero. In other words, $$x[-1]=x[-2]=y[-1]=y[-2]=0.$$

At time k=0 the following computation is done, according to FIG. 11:

$$y[0]=b_0x[0]+b_1x[-1]+b_2x[-2]-\alpha_1y[-1]-\alpha_2y[-2].$$

Then, the registers are then updated so that the register marked by x[k−1] now holds x[0], the register marked by x[k−2] now holds x[−1], the register marked by y[k−1] holds y[0], and the register marked by y[k−2] holds y[−1].

At time k=1 the following computation is done:

$$y[1]=b_0x[1]+b_1x[0]+b_2x[-1]-\alpha_1y[0]-\alpha_2y[-1]$$

Then, the register update is again completed so that the register marked by x[k−1] now holds x[1], the register marked by x[k−2] now holds x[0], the register marked by y[k−1] holds y[1], and the register marked by y[k−2] holds y[0].

This process is then repeated over and over for all instants k: A new input, x[k], is brought in, a new output y[k] is computed, and the state variables are updated.

In general, then, the digital filtering operation can be viewed as a set of multiplications and additions performed on a data stream x[0], x[1], x[2], . . . using the coefficients b0, b1, b2, a1, a2 and the state variables x[k−1], x[k−2], y[k−1], y[k−2].

The manifestation of this in specific situations is instructive. Examination of the bell filter that constitutes the fundamental building-block of graphic equalizer 107 is helpful. As discussed above, the bell filter is implemented with a sampling frequency Fs, gain G at a center frequency fc, and quality factor Q as $$H(z)=\frac{1}{2}(1+G)A(z)+\frac{1}{2}(1-G)$$

where A(z) is an allpass filter defined by $$A(z)=\frac{k_2+k_1(1+k_2)z^{-1}+z^{-2}}{1+k_1(1+k_2)z^{-1}+k_2z^{-2}}$$

where k1 and k2 are computed from fc and Q via the equations $$k_1=\frac{1-\tan\left(\frac{\pi f_c}{QF_s}\right)}{1+\tan\left(\frac{\pi f_c}{QF_s}\right)}$$

and $$k_2=-\cos(2\pi f_c/F_s)$$

The values k1 and k2 are pre-computed and stored in a table in memory. To implement a filter for specific values of Q and fc, the corresponding values of k1 and k2 are looked up in this table. Since there are eleven specific values of fc and sixteen specific values of Q in the algorithm, and the filter operates at a single sampling frequency, Fs, and only k2 depends on both fc and Q, the overall storage requirements for the k1 and k2 coefficient set is quite small (11×16×2 words at worst).

Observe from the equation above for A(z) that its coefficients are symmetric. That is, the equations can be re-written as $$A(z)=\frac{z^{-2}+\text{geq\_b1}z^{-1}+\text{geq\_b0}}{1+\text{geq\_b1}z^{-1}+\text{geq\_b0}z^{-2}}$$

where $$\text{geq\_b0}=k_2$$

and $$\text{geq\_b1}=k_1(1+k_2).$$

Observe that A(z) as given in the above equation implies the difference equation $$y[k]=geq\_b0x[k]+geq\_b1x[k-1]+x[k-2]-geq\_b1y[k-1]-geq\_b0y[k-2],$$

which can be rearranged to yield $$y[k]=geq\_b0(x[k]-y[k-2])+geq\_b1(x[k-1]-y[k-1])+x[k-2]$$

In a specific embodiment, the state variables may be stored in arrays xv[ ] and yv[ ] with xv[0] corresponding to x[k−2], xv[1] corresponding to x[k−1], yv[0] corresponding to y[k−2] and yv[1] corresponding to y[k−1]. Then the following code-snippet implements a single step of the allpass filter:

```
void allpass(float *xv, float *yv, float *input, float *output)
{
    *output = geq_b0 * (*input − yv[0]) + geq_b1 * (xv[1] −
    yv[1]) + xv[0]
    xv[0] = xv[1]; \\ update
    xv[1] = *input; \\ update
    yv[0] = yv[1]; \\update
    yv[1] = *output; \\update
}
```

Now the loop must be incorporated around the allpass filter as per the equations above. This is trivially realized by the following:

```
void bell(float *xv, float *yv, float gain, float *input, float *output)
{
    allpass(xv, yv, input, output);
    *output = 0.5 * (1.0-gain) * (*output) + 0.5 * (1.0+gain) * (*input);
}
```

More concisely, the previous two code snippets can be combined into a single routine that looks like this:

```
void bell(float *xv, float *yv, float gain, float *input, float *output)
{
    float ap__output = geq__b0 * (*input - yv[0])
    + geq__b1 * (xv[1] - yv[1]) + xv[0]
    xv[0] = xv[1]; \\ update
    xv[1] = *input; \\ update
    yv[0] = yv[1]; \\update
    yv[1] = *output; \\update
    *output = 0.5 * (1.0-gain) * ap__output + 0.5 * (1.0+gain) * (*input);
}
```

The first-order filter will now be examined in detail. These filters can be described by the transfer function $$H(z) = \frac{b_0 + b_1 z^{-1}}{1 + a_1 z^{-1}}.$$

which corresponds to the difference equation.

$$y[k]=b_0x[k]+b_1x[k-1]-\alpha_1y[k-1].$$

Figure 12:
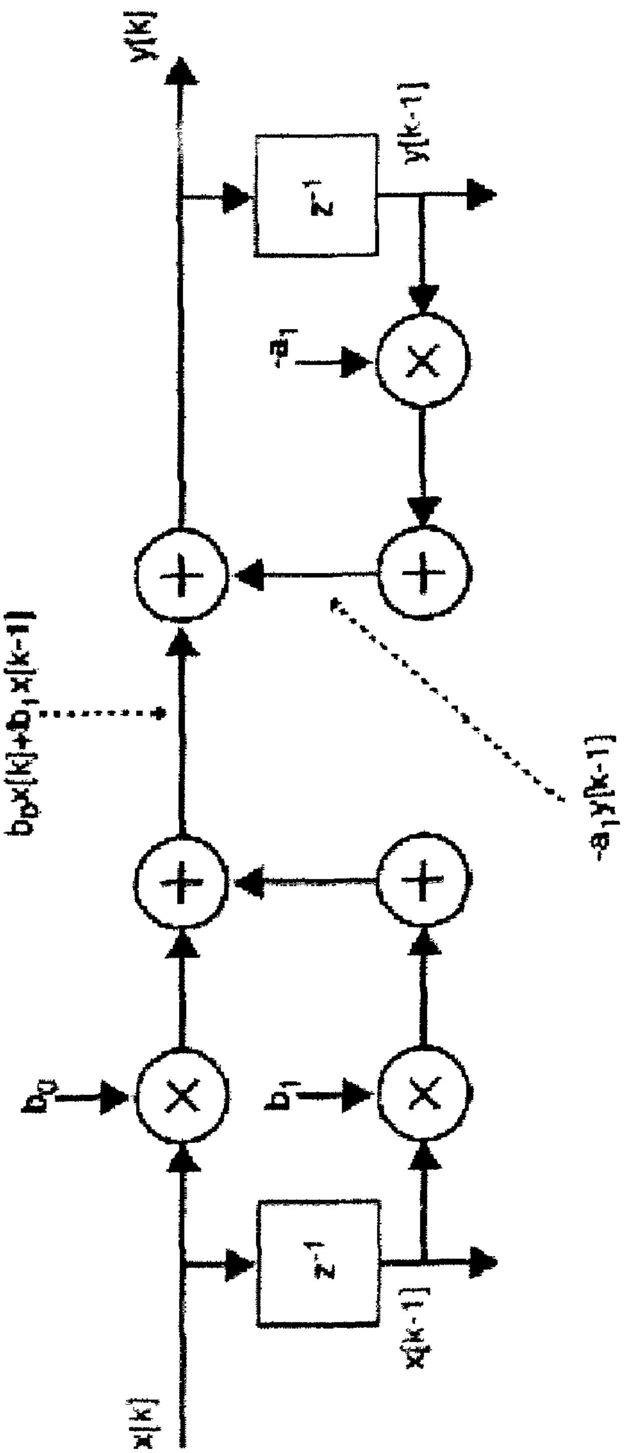
FIG. 12 shows a block diagram of a direct form type 1 implementation of second order transfer function used in one embodiment of the digital signal processing method of the present invention.

FIG. 12 illustrates the DF1 architecture for a first-order filter according to one embodiment of the present invention. Referring now to FIG. 12, the multiplier coefficients in this filter structure correspond in a clear way to the coefficients in the transfer function and in the difference equation. The output of the digital filter is computed as follows:

Initially, every one of the state variables is set to zero. In other words, $$x[-1]=y[-1]=0.$$

At time k=0 the following computation is done, according to FIG. 11:

$$y[0]=b_0x[0]+b_1x[-1]-\alpha_1y[-1].$$

Then, the registers are then updated so that the register marked by x[k−1] now holds x[0], and the register marked by y[k−1] holds y[0].

At time k=1 the following computation is done:

$$y[1]=b_0x[1]+b_1x[0]-\alpha_1y[0]$$

Then, the register update is again completed so that the register marked by x[k−1] now holds x[1] and the register marked by y[k−1] holds y[1].

This process is then repeated over and over for all instants k: A new input, x[k], is brought in, a new output y[k] is computed, and the state variables are updated.

In general, then, the digital filtering operation can be viewed as a set of multiplications and additions performed on a data stream x[0], x[1], x[2], . . . using the coefficients b0, b1, a1 and the state variables x[k−1], y[k−1].

Referring back to the equations above, a first-order shelving filter can be created by applying the equation $$A(z) = \frac{k_2 + k_1(1+k_2)z^{-1} + z^{-2}}{1 + k_1(1+k_2)z^{-1} + k_2 z^{-2}}$$

to the first-order allpass filter A(z), where $$A(z) = \frac{\alpha - z^{-1}}{1 - \alpha z^{-1}}$$

where α is chosen such that $$\alpha = \frac{\left(1 - \sin\left(\frac{2\pi f_c}{F_s}\right)\right)}{\cos\left(\frac{2\pi f_c}{F_s}\right)}$$

where fc is the desired corner frequency and Fs is the sampling frequency. The allpass filter A(z) above corresponds to the difference equation $$y[k]=\alpha x[k]-x[k-1]+\alpha y[k-1].$$

If allpass coefficient a is referred to as allpass coef and the equation terms are rearranged, the above equation becomes $$y[k]=\text{allpass\_coef}(x[k]+y[k-1])-x[k-1].$$

This difference equation corresponds to a code implementation of a shelving filter that is detailed below.

One specific software implementation of digital signal processing method 100 will now be detailed.

Input gain adjustment 101 and output gain adjustment 109, described above, may both be accomplished by utilizing a "scale" function, implemented as follows:

```
void scale(gain, float *input, float *output)
{
    for (i = 0; i < NSAMPLES; i++)
    {
        *output++ = inputGain * (*input++);
    }
}
```

First low shelf filter 102 and second low shelf filter 105, described above, may both be accomplished by utilizing a "low_shelf" function, implemented as follows:

```
void low__shelf(float *xv, float *yv, float *wpt, float *input, float *output)
{
    float 1;
    int i;
    for (i = 0; i < NSAMPLES; i++)
    {
        if (wpt[2] < 0.0) \\ cut mode, use conventional realization
        { \\ allpass__coef = alpha
            yv[0] = ap__coef * (*input) + (ap__coef * ap__coef -
            1.0) * xv[0];
            xv[0] = ap__coef * xv[0] + *input;
            *output++ = 0.5 * ((1.0 + wpt[0]) * (*input++) + (1.0 -
            wpt[0]) * yv[0]);
        }
        else \\ boost mode, use special realization
```

-continued

```
        {
            1 = (ap__coef * ap__coef- 1.0) * xv[0];
            *output = wpt[1] * ((*input++) - 0.5 * (1.0 - wpt[0]) * 1);
            xv[0] = ap__coef * xv[0] + *output++;
        }
    }
}
```

As this function is somewhat complicated, a detailed explanation of it is proper. First, the function declaration provides:

```
void low_shelf(float*xv,float*yv,float*wpt,
    float*input,float*output)
```

The "low_shelf" function takes as parameters pointers to five different floating-point arrays. The arrays xv and yv contain the "x" and "y" state variables for the filter. Because the shelving filters are all first-order filters, the state-variable arrays are only of length one. There are distinct "x" and "y" state variables for each shelving filter used in digital signal processing method 100. The next array used is the array of filter coefficients "wpt" that pertain to the particular shelving filter, wpt is of length three, where the elements wpt[0], wpt[1], and wpt[2] describe the following:

$$wpt[0]=G$$

$$wpt[1]=2[(1G)+\alpha(1-G)]^{-1}$$

$$wpt[2]=-1 \text{ when cutting, } 1 \text{ when boosting}$$

and α is the allpass coefficient and G is the shelving filter gain. The value of a is the same for all shelving filters because it is determined solely by the corner frequency (it should be noted that and all four of the shelving filters in digital signal processing method 100 have a corner frequency of 1 kHz). The value of G is different for each of the four shelving filters.

The array "input" is a block of input samples that are fed as input to each shelving filter, and the results of the filtering operation are stored in the "output" array.

The next two lines of code,

```
float 1;

int i;
```

allocate space for a loop counter variable, i, and an auxiliary quantity, 1, which is the quantity 10[k] from FIG. 9.

The next line of code,

```
for (i=0; i<NSAMPLES; i++
```

performs the code that follows a total of NSAMPLES times, where NSAMPLES is the length of the block of data used in digital signal processing method 100.

This is followed by the conditional test

```
if (wpt[2]<0.0)
```

and, recalling the equations discussed above, wpt[2]<0 corresponds to a shelving filter that is in "cut" mode, whereas wpt[2]>=0 corresponds to a shelving filter that is in "boost" mode. If the shelving filter is in cut mode the following code is performed:

```
if (wpt[2] < 0.0) \\ cut mode, use conventional realization
{   \\ allpass_coef = alpha
    yv[0] = ap__coef * (*input) + (ap__coef * ap__coef - 1.0) * xv[0];
    xv[0] = ap__coef * xv[0] + *input;
```

-continued

```
    *output++ = 0.5 * ((1.0 + wpt[0]) * (*input++) +(1.0 - wpt[0])
    * yv[0]);
}
```

The value xv[0] is simply the state variable x[k] and yv[0] is just yv[k]. The code above is merely an implementation of the equations $$y[k]=\alpha\cdot in[k]+(\alpha_2-1)\cdot x[k]$$

$$x[k]=\alpha\cdot x[k]+in[k]$$

$$out[k]=\tfrac{1}{2}((1+G)\cdot in[k]+(1-G)\cdot y[k])$$

If the shelving filter is in cut mode the following code is performed:

```
else \\ boost mode, use special realization
{
    l = (ap__coef * ap__coef - 1.0) * xv[0];
    *output = wpt[1] * ((*input++) - 0.5 * (1.0 - wpt[0]) * 1);
    xv[0] = ap__coef * xv[0] + *output++;
}
```

which implements the equations $$t_0[k]=(\alpha^2-1)\cdot x[k]$$

$$out[k]=2[(1+G)+\alpha(1-G)]^{-1}\cdot(in[k]-\tfrac{1}{2}(1-G)l_G[k])$$

$$x[k]=\alpha\cdot x[k-1]+out[k]$$

First high shelf filter 103 and second high shelf filter 106, described above, may both be accomplished by utilizing a "high_shelf" function, implemented as follows:

```
void high__shelf(float *xv, float *yv, float *wpt, float *input, float
*output)
{
    float l;
    int i;
    for (i = 0; i < NSAMPLES; i++)
    {
        if (wpt[2] < 0.0) \\ cut mode, use conventional realization,
        { \\ allpass__coef = alpha
            yv[0] = allpass__coef * (*input) + (allpass__coef *
            allpass__coef - 1.0) *
        xv[0];
            xv[0] = allpass__coef * xv[0] + *input;
            *output++ = 0.5 * ((1.0 + wpt[0]) * (*input++) -
            (1.0 - wpt[0]) * yv[0]);
        }
        else \\ boost mode, use special realization
        {
            l = (allpass__coef * allpass__coef - 1.0) * xv[0];
            *output = wpt[1] * ((*input++) + 0.5 * (1.0 - wpt[0])
            * l);
            xv[0] = allpass__coef * xv[0] + *output++;
        }
    }
}
```

Implementing the high-shelving filter is really no different than implementing the low-shelving filter. Comparing the two functions above, the only-substantive difference is in the sign of a single coefficient. Therefore, the program flow is identical.

Graphic equalizer 107, described above, may be implemented using a series of eleven calls to a "bell" filter function, implemented as follows:

```
void bell(float *xv, float *yv, float *wpt, float *input, float *output)
{
    float geq__gain = wpt[0]; \\ G
    float geq__b0 = wpt[1]; \\ k2
    float geq__b1 = wpt[2]; \\ k1(1+k2)
    float ap__output;
    int i;
    for (i = 0; i < NSAMPLES; i++)
    {
        ap__output = geq__b0 * (*input − yv[0]) + geq__b1 * (xv[1] −
        yv[1]) + xv[0];
        xv[0] = xv[1]; \\update
        xv[1] = *input; \\ update
        yv[0] = yv[1]: \\update
        yv[1] = *output; \\update
        *output++ = 0.5 * (1.0−gain) * ap__output + 0.5 * (1.0+gain) *
        (*input++):
    }
}
```

The function bell( ) takes as arguments pointers to arrays xv (the "x" state variables), yv (the "y" state variables), wpt (which contains the three graphic EQ parameters G, k2, and k1(1+k2)), a block of input samples "input", and a place to store the output samples. The first four statements in the above code snippet are simple assignment statements and need no explanation.

The for loop is executed NSAMPLES times, where NSAMPLES is the size of the block of input data. The next statement does the following:

*ap*_output=*geq*__*b*0*(*input__*yv[*0])+*geq*__*b*1*(*xv[*1*]*−*yv[*1])+*xv[*0]

The above statement computes the output of the allpass filter as described above. The next four statements do the following:

*xv[*0*]*=*xv[*1];

shifts the value stored in x[k−1] to x[k−2].

*xv[*1]=*input;

shifts the value of input[k] to x[k−1].

*yv[*0*]*=*yv[*1];

shifts the value stored in y[k−1] to y[k−2].

*yv[*1]=*output;

shifts the value of output[k], the output of the allpass filter, to y[k−1].

Finally, the output of the bell filter is computed as

*output++=0.5*(1.0−gain)**ap*_output+0.5*(1.0+gain)* (*input++);

First compressor 104 and second compressor 108, described above, may be implemented using a "compressor" function, implemented as follows:

```
void compressor(float *input, float *output, float *wpt, int index)
{
    static float level;
    float interp, GR, excessGain, L, invT, ftempabs;
    invT = wpt[2];
    int i, j;
    for (i = 0; i < NSAMPLES; i ++)
    {
        ftempabs = fabs(*input++);
        level = (ftempabs >= level)? wpt[0] * (level − ftempabs) +
        ftempabs : wpt[1] * (level − ftempabs) + ftempabs;
        GR = 1.0;
```

-continued

```
        if (level *invT > 1.0)
        {
            excessGain = level *invT;
            interp = excessGain − trunc(excessGain);
            j = (int) trunc(excessGain) − 1;
            if (j < 99)
            {
                GR = table[index][j] + interp * (table[index][j+1] −
                table[index][j]);
                // table[ ][ ] is the exponentiation table
            }
            else
            {
                GR = table[index][99];
            }
        }
        *output++ = *input++ * GR;
    }
}
```

The compressor function takes as input arguments pointers to input, output, and wpt arrays and an integer, index. The input and output arrays are used for the blocks of input and output data, respectively. The first line of code, static float level;

allocates static storage for a value called "level" which maintains the computed signal level between calls to the function. This is because the level is something that needs to be tracked continuously, for the entire duration of the program, not just during execution of a single block of data.

The next line of code, float interp, GR, excessGain, *L*, inv*T*, *f*tempabs;

allocates temporary storage for a few quantities that are used during the computation of the compressor algorithm; these quantities are only needed on a per-block basis and can be discarded after each pass through the function.

The next line of code, inv*T*=*wpt[*2];

extracts the inverse of the compressor threshold, which is stored in wpt[2], which is the third element of the wpt array. The other elements of the wpt array include the attack time, the release time, and the compressor ratio.

The next line of code indicates that the compressor loop is repeated NSAMPLES times. The next two lines of code implement the level computation as per the equations above. To see this, notice that the line level=(*f*tempabs>=level)?*wpt[*0]*(level−*f*tempabs)+*f*tempabs:*wpt[*1]*(level−*f*tempabs)+*f*tempabs;

is equivalent to the expanded statement

```
if (ftempabs >= level)
{
    level = wpt[0] * (level − ftempabs) + ftempabs;
}
else
{
    level = wpt[1] * (level − ftempabs) + ftempabs
}
```

which is what is needed to carry out the above necessary equation, with wpt[0] storing the attack constant αatt and wpt[1] storing the release constant αrel.

Next, it can be assumed that the gain reduction, GR, is equal to unity. Then the comparison if (level*inv$T$>1.0)

is performed, which is the same thing as asking if level>T, i.e., the signal level is over the threshold. If it is not, nothing is done. If it is, the gain reduction is computed. First, the excess gain is computed as excessGain=level*inv$T$ as calculated using the equations above. The next two statements, interp=excessGain−trunc(excessGain);

$j$=(int)trunc(excessGain)−1;

compute the value of index into the table of exponentiated values, as per the equations above. The next lines,

```
if (j < 99)
{
    GR = table[index][j] + interp * (table[index][j+i] − table[index][j]);
    // table[ ][ ] is the exponentiation table
}
else
{
    GR = table[index][99];
}
```

implement the interpolation explained above. The two-dimensional array, "table," is parameterized by two indices: index and j. The value j is simply the nearest integer value of the excess gain. The table has values equal to $$\text{table [index]}[j] = (j)^{\frac{1-index}{index}}$$

which can be recognized as the necessary value from the equations above, where the "floor" operation isn't needed because j is an integer value. Finally, the input is scaled by the computed gain reduction, GR, as per

*output++=*input++*GR;

and the value is written to the next position in the output array, and the process continues with the next value in the input array until all NSAMPLE values in the input block are exhausted.

It should be noted that in practice, each function described above is going to be dealing with arrays of input and output data rather than a single sample at a time. This doesn't really change the program much, as hinted by the fact that the routines above were passed their inputs and outputs by reference. Assuming that the algorithm is handed a block of NSAMPLES in length, the only modification needed to incorporate arrays of data into the bell-filter functions is to incorporate looping into the code as follows:

```
void bell(float *xv, float *yv, float gain, float *input, float *output)
{
    float ap__output;
    int i;
    for (i = 0; i < NSAMPLES; i++)
    {
        ap__output = geq__b0 * (*input − yv[0])
        + geq__b1 * (xv[1] − yv[1]) + xv[0]
        xv[0] = xv[1]; \\update
        xv[1] = *input; \\ update
        yv[0] = yv[1]; \\update
        yv[1] = *output; \\update
        *output++ = 0.5 * (1.0−gain) * ap__output + 0.5 *
        (1.0+gain) * (*input++);
    }
}
```

Digital signal processing method 100 as a whole, may be implemented as a program that calls each of the above functions, implemented as follows:

```
// it is assumed that floatBuffer contains a block of
// NSAMPLES samples of floating-point data.
// The following code shows the instructions that
// are executed during a single pass
scale(inputGain, floatBuffer, floatBuffer);
low__shelf(xv1__ap, yv1__ap, &working__table[0], floatBuffer, floatBuffer);
high__shelf(xv2__ap, yv2__ap, &working__table[3], floatBuffer, floatBuffer);
compressor(floatBuffer, floatBuffer, &working__table[6], ratio1Index);
low__shelf(xv3__ap__left, yv3__ap__left, xv3__ap__right, yv3__ap__right, &working__table[11],
floatBuffer, floatBuffer);
high__shelf(xv4__ap__left, yv4__ap__left, xv4__ap__right, yv4__ap__right, &working__table[14],
floatBuffer, floatBuffer);
bell(xv1__geq, yv1__geq, &working__table[17], floatBuffer, floatBuffer);
bell(xv2__geq, yv2__geq, &working__table[20], floatBuffer, floatBuffer);
bell(xv3__geq, yv3__geq, &working__table[23], floatBuffer, floatBuffer);
bell(xv4__geq, yv4__geq, &working__table[26], floatBuffer, floatBuffer);
bell(xv5__geq, yv5__geq, &working__table[29], floatBuffer, floatBuffer);
bell(xv6__geq, yv6__geq, &working__table[32], floatBuffer, floatBuffer);
bell(xv7__geq, yv7__geq, &working__table[35], floatBuffer, floatBuffer);
bell(xv8__geq, yv8__geq, &working__table[38], floatBuffer, floatBuffer);
bell(xv9__geq, yv9__geq, &working__table[41], floatBuffer, floatBuffer);
bell(xv10__geq, yv10__geq, &working__table[44], floatBuffer, floatBuffer);
bell(xv11__geq, yv11__geq, &working__table[47], floatBuffer, floatBuffer):
compressor(floatBuffer, floatBuffer, &working__table[50], ratio1Index);
scale(outputGain, floatBuffer, floatBuffer);
```

As can be seen, there are multiple calls to the scale function, the low shelf function, the highshelf function, the bell function, and the compressor function. Further, there are references to arrays called xv1, yv1, xv2, yv2, etc. These arrays are state variables that need to be maintained between calls to the various routines and they store the internal states of the various filters in the process. There is also repeated reference to an array called working table. This table holds the various pre-computed coefficients that are used throughout the algorithm. Algorithms such as this embodiment of digital signal processing method 100 can be subdivided into two parts: the computation of the coefficients that are used in the real-time processing loop and the real-time processing loop itself. The real-time loop consists of simple multiplications and additions, which are simple to perform in real-time, and the coefficient computation, which requires complicated transcendental functions, trigonometric functions, and other operations which can not be performed effectively in real-time. Fortunately, the coefficients are static during run-time and can be pre-computed before real-time processing takes place. These coefficients can be specifically computed for each audio device in which digital signal processing method 100 is to be used. Specifically, when digital signal processing method 100 is used in a mobile audio device configured for use in vehicles, these coefficients may be computed separately for each vehicle the audio device may be used in to obtain optimum performance and to account for unique acoustic properties in each vehicle such as speaker placement, passenger compartment design, and background noise.

For example, a particular listening environment may produce such anomalous audio responses such as those from standing waves. For example, such standing waves often occur in small listening environments such as an automobile. The length of an automobile, for example, is around 400 cycles long. In such an environment, some standing waves are set up at this frequency and some below. Standing waves present an amplified signal at their frequency which may present an annoying acoustic signal. Vehicles of the same size, shape, and of the same characteristics, such as cars of the same model, may present the same anomalies due to their similar size, shape, structural make-up, speaker placement, speaker quality, and speaker size. The frequency and amount of adjustment performed, in a further embodiment, may be configured in advance and stored for use in graphic equalizer 107 to reduce anomalous responses for future presentation in the listening environment.

The "working tables" shown in the previous section all consist of pre-computed values that are stored in memory and retrieved as needed. This saves a tremendous amount of computation at run-time and allows digital signal processing method 100 to run on low-cost digital signal processing chips.

It should be noted that the algorithm as detailed in this section is written in block form. The program described above is simply a specific software embodiment of digital signal processing method 100, and is not intended to limit the present invention in any way. This software embodiment may be programmed upon a computer chip for use in an audio device such as, without limitation, a radio, MP3 player, game station, cell phone, television, computer, or public address system. This software embodiment has the effect of taking an audio signal as input, and outputting that audio signal in a modified form.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational, descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for processing a signal comprising:

adjusting a gain of the signal a first time;

filtering the adjusted signal with a first low shelf filter;

filtering the signal received from the first low shelf filter with a first high shelf filter;

compressing the filtered signal with a first compressor;

filtering the signal with a second low shelf filter;

filtering the signal with a second high shelf filter;

processing the signal with a graphic equalizer;

compressing the processed signal with a second compressor;

adjusting the gain of the compressed signal a second time; and outputting the signal.

2. The method of claim 1, wherein the signal is an audio signal.

3. The method of claim 1, wherein adjusting the gain of the received signal a first time is done with a first gain amplifier and adjusting the gain of the signal a second time is done with a second gain amplifier.

4. The method of claim 1, wherein the first low shelf filter has a cutoff frequency at 1000 Hz.

5. The method of claim 1, wherein the first high shelf filter has a cutoff frequency at 1000 Hz.

6. The method of claim 1, wherein the graphic equalizer comprises eleven cascading second order filters.

7. The method of claim 6, wherein each of the second order filter is a bell filter.

8. The method of claim 7, wherein the first of the eleven filters has a center frequency of 30 Hz and the eleventh filter of the eleven filters has a center frequency of 16000 Hz.

9. The method of claim 8, wherein the second to tenth filters are centered at approximately one octave intervals from each other.

10. The audio system of claim 1, wherein the second low shelf filter is a magnitude-complementary low-shelf filter.

11. A speaker system comprising:

a first gain amplifier configured to amplify a signal;

a first low shelf filter configured to filter the amplified signal;

a first high shelf filter configured to filter the signal received from the first low shelf filter;

a first compressor configured to compress the filtered signal;

a second low shelf filter configured to filter the first compressed signal;

a second high shelf filter configured to filter a received signal after the received signal is filtered with the second low shelf filter;

a graphic equalizer configured to process the filtered signal;

second compressor configured to compress the processed signal; and a second gain amplifier configured to amplify the gain of the second compressed signal and to output an output signal.

12. The speaker system of claim 11, wherein the signal is an audio signal.

13. The speaker system of claim 11, wherein the first low shelf filter has a cutoff frequency at 1000 Hz.

14. The speaker system of claim 11, wherein the first high shelf filter has a cutoff frequency at 1000 Hz.

15. The speaker system of claim 11, wherein the graphic equalizer comprises eleven cascading second order filters.

16. The vehicle speaker system of claim 15, wherein each of the second order filter is a bell filter.

17. The speaker system of claim 16, wherein the first of the eleven filters has a center frequency of 30 Hz and the eleventh filter of the eleven filters has a center frequency of 16000 Hz.

18. The speaker system of claim 17, wherein the second to tenth filters are centered at approximately one octave intervals from each other.

19. The speaker system of claim 11, wherein the second low shelf filter is a magnitude-complementary low-shelf filter.

* * * * *